US006845126B2

(12) United States Patent
Dent et al.

(10) Patent No.: US 6,845,126 B2
(45) Date of Patent: Jan. 18, 2005

(54) SYSTEM AND METHOD FOR ADAPTIVE ANTENNA IMPEDANCE MATCHING

(75) Inventors: Paul W. Dent, Pittsboro, NC (US); Rodney A. Dolman, Holly Springs, NC (US)

(73) Assignee: Telefonaktiebolaget L.M. Ericsson (publ) (SE)

( * ) Notice: Subject to any disclaimer, the term of this patent is extended or adjusted under 35 U.S.C. 154(b) by 110 days.

(21) Appl. No.: 10/423,713

(22) Filed: Apr. 25, 2003

(65) Prior Publication Data

US 2003/0193997 A1 Oct. 16, 2003

Related U.S. Application Data

(63) Continuation-in-part of application No. 09/770,804, filed on Jan. 26, 2001.

(51) Int. Cl.[7] .............................. H04B 1/38; H04B 1/26
(52) U.S. Cl. .......................... 375/219; 455/73; 455/324
(58) Field of Search ................................ 375/219, 316, 375/295, 296, 285, 346; 455/73, 83, 324, 84, 85, 86, 87

(56) References Cited

U.S. PATENT DOCUMENTS

| | | | |
|---|---|---|---|
| 4,028,645 A | | 6/1977 | Tressa |
| 4,422,047 A | * | 12/1983 | Wright .......................... 330/51 |
| 4,580,092 A | | 4/1986 | Squire |
| 5,241,702 A | * | 8/1993 | Dent ........................ 455/278.1 |
| 5,483,680 A | | 1/1996 | Talbot |
| 5,564,086 A | * | 10/1996 | Cygan et al. ................ 455/126 |
| 5,749,051 A | * | 5/1998 | Dent ............................ 455/324 |
| 5,777,475 A | | 7/1998 | Vester |
| 5,778,308 A | * | 7/1998 | Sroka et al. .............. 455/115.1 |
| 5,890,051 A | * | 3/1999 | Schlang et al. ................ 455/76 |
| 6,009,312 A | * | 12/1999 | Dolman ........................ 455/76 |
| 6,297,780 B1 | | 10/2001 | Kirisawa |
| 2002/0101907 A1 | | 8/2002 | Phillips |

FOREIGN PATENT DOCUMENTS

| | | |
|---|---|---|
| EP | 0 865165 A2 | 9/1998 |
| EP | 1 209 815 A1 | 5/2002 |
| GB | 2 365 628 A | 2/2002 |
| WO | WO 0031885 | 6/2000 |
| WO | WO0173454 A1 | 10/2000 |

OTHER PUBLICATIONS

WCDMA, Chapter 6, pp. 171–205.

* cited by examiner

*Primary Examiner*—Tesfaldet Bocure
(74) *Attorney, Agent, or Firm*—Coats & Bennett, P.L.L.C.

(57) ABSTRACT

A transceiver includes a transmitter and a homodyne receiver, wherein the receiver is used to process both antenna-received and antenna-reflected signals. Thus, during a receive mode, for example, the receiver downconverts antenna-received signals to baseband signals, which are then processed to recover receive signal information. Then, during a transmit mode for example, antenna-reflected transmit signals are fed back to the receiver, which is retuned to the desired transmit frequency, and thus downconverts the reflected transmit signals to baseband signals. These baseband signals are then processed to obtain a characterization of impedance mismatch between the transceiver's transmitter and the associated antenna. An adjustable matching network disposed in the transmit signal path thus may be adjusted based on the characterization to reduce the mismatch. Such configurations may be used with either single-band or multi-band embodiments of the transceiver, and the transceiver may be used in both TDMA and CDMA communication systems.

27 Claims, 10 Drawing Sheets

SYSTEM AND METHOD FOR ADAPTIVE ANTENNA IMPEDANCE MATCHING

RELATED APPLICATIONS

The present application is a continuation-in-part application and claims priority under 35 U.S.C. § 120 from the co-pending parent application filed on Jan. 26, 2001, and entitled "ADAPTIVE ANTENNA OPTIMIZATION NETWORK." That parent application, assigned Ser. No. 09/770,804 and published under Publication No. 2002/0101907 A1, is incorporated in its entirety herein by reference.

BACKGROUND OF THE INVENTION

The present invention generally relates to wireless communications, and particularly relates to antenna impedance matching in a wireless communication device.

Impedance matching generally refers to the relationship between a source impedance and a load impedance. Maximum power transfer occurs when the source impedance matches the load impedance. For time-varying signals, matched source and load impedances also results in a minimum Voltage Standing Wave Ratio (VSWR), i.e., results in minimum signal reflections from the load.

The desirability of impedance matching is so well know that it is taken as a given that one should "match" source and load impedances as part of the design effort. While impedance matching generally offers no special challenges in environments where the parameters affecting source and load impedances remain relatively fixed, impedance matching becomes decidedly more difficult in dynamic environments, such as in the context of handheld or portable radio communication devices.

Typical portable communication devices are handheld, meaning that the orientations and positions of their antennas change during usage, such as when a user of a radio cellular telephone changes hands or "crooks" the phone between his or her neck and shoulder. These and other actions change antenna impedance and complicate the task of maintaining a good impedance match between the device's transmitter and the antenna.

SUMMARY OF THE INVENTION

The present invention comprises a method and apparatus to provide dynamic characterization of impedance mismatches in a radio transmitter. A transceiver according to the present invention feeds back transmit signals reflected from its associated antenna during signal transmission to its receiver. It then processes the downconverted baseband signals obtained from these antenna-reflected signals to characterize the impedance mismatch between its transmitter and the antenna. The transceiver may adjust, or otherwise "tune," an impedance matching circuit to obtain improved impedance matching between its transmitter and the associated antenna based on such characterizations.

In an exemplary transceiver comprising a transmitter and a homodyne receiver, an exemplary method of characterizing an impedance mismatch between the transmitter and an associated antenna comprises configuring the homodyne receiver to receive and downconvert antenna-received signals to baseband signals during a first mode of transceiver operation and to receive and downconvert antenna-reflected signals to baseband signals during a second mode of transceiver operation. With this arrangement, the transceiver processes the baseband signals generated by the homodyne receiver in the first mode to obtain received signal data and processes the baseband signals generated by the homodyne receiver in the second mode to characterize an impedance mismatch between the transmitter and the associated antenna.

The exemplary transceiver further includes processing and control circuits to process the receiver's baseband output signal(s), and to control the receiver and transmitter during the various modes of operation. Further exemplary transceiver elements include one or more directional couplers to provide a feedback path for directing the antenna-reflected transmit signals into the homodyne receiver, a transmit/receive switch or duplexer circuit to couple the transmitter and receiver to the associated antenna, and an adjustable impedance matching circuit disposed somewhere within the transmit signal path.

For example, a cellular radiotelephone according to one embodiment of the present invention comprises an antenna for transmitting signals at any channel in at least one frequency band and a receiver. The transmitter and the receiver are connected to the antenna by a transmit/receiver duplexer, which can be a duplexing filter or alternatively can be a transmit/receive switch. According to the invention, an electronically adjustable matching network is located anywhere in the path between the transmitter output and the antenna. For example, the adjustable network in one implementation is located between the antenna and the duplexer so as to be operable in both the transmit path and the receive path. In another implementation, the adjustable matching network is located between the transmitter output and the duplexer so as to be operable only in the transmit path.

To control the adjustable matching network, a directional coupler is located between the transmitter output and the matching network to separate transmit signals reflected from the antenna. The reflected transmit signals are then routed to the receiver itself, which, in an exemplary embodiment, is a direct conversion or homodyne receiver. Advantageously, a local oscillator circuit in the homodyne receiver may be used to generate a receive frequency signal used for downconverting the antenna-received signals during a receive mode of operation, and to generate a transmit frequency signal used to generate the transmit signal at the desired carrier frequency and used to downconvert the antenna-reflected transmit signals. Thus in the transmit mode, the oscillator is tuned to the transmit frequency which thereby also tunes the homodyne receiver to receive at the transmit frequency and allows the baseband signal, e.g., the in-phase and quadrature output signals to be processed to obtain control signals for adjusting the antenna matching components.

Further advantage may be gained by using a "modulatable" local oscillator circuit, such as through use of a frequency synthesizer that can be modulated. In the receive mode, the local oscillator circuit thus generates an unmodulated mixing signal at the desired receive frequency and, in the transmit mode, it generates a modulated transmit signal at the desired transmit frequency. The modulated transmit signal is fed to the transmitter, which may comprise a power amplifier circuit that provides the desired gain for the modulated transmit signal, and is further fed to the homodyne receiver's downconverter circuits, e.g., its mixers, such that downconversion of the antenna-reflected transmit signal substantially removes transmit signal modulations and thereby simplifies signal processing with respect to impedance characterization.

DETAILED DESCRIPTION OF THE INVENTION

Figure 1:
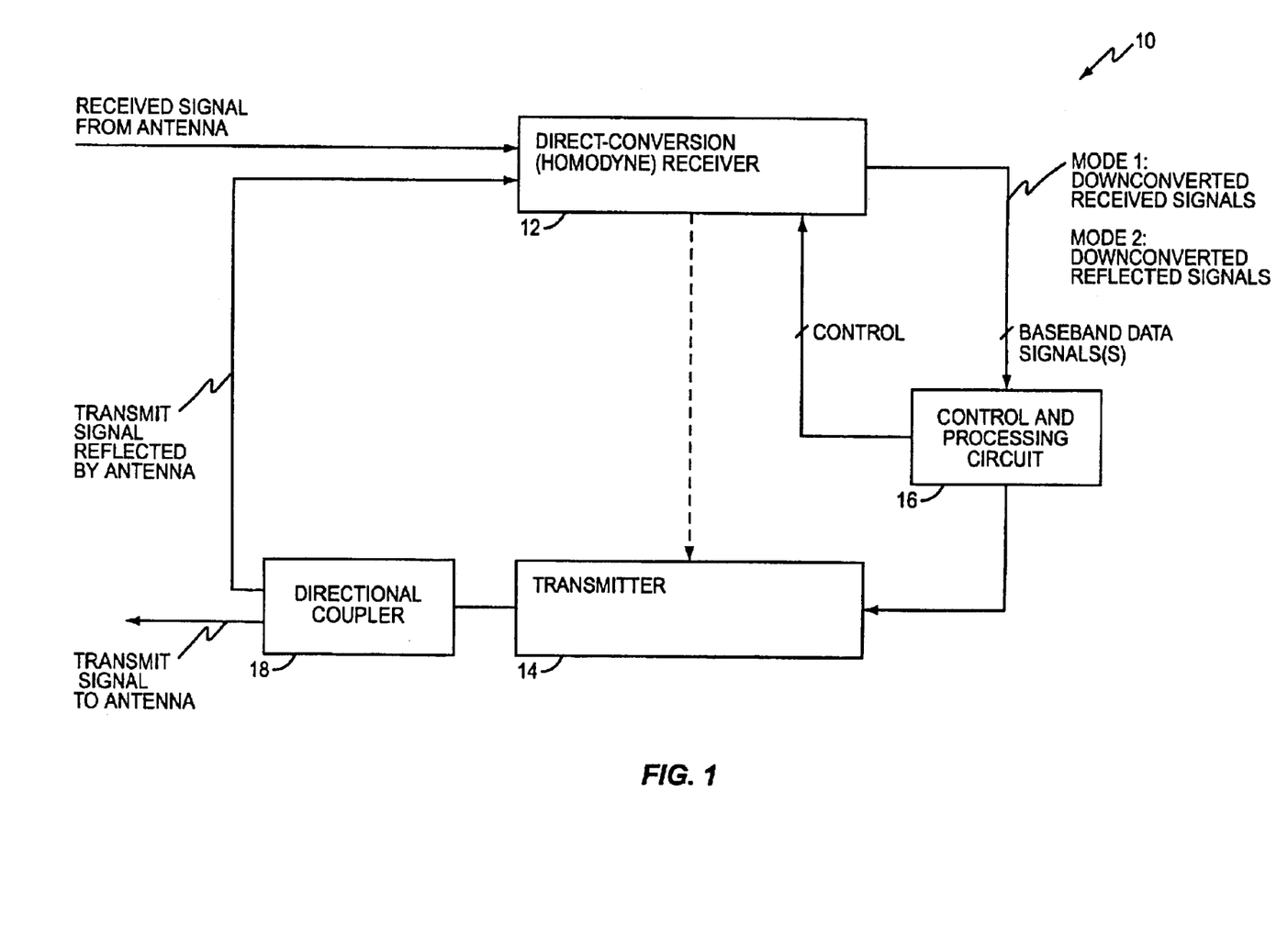
FIG. 1 is a diagram of an exemplary transceiver according to one embodiment of the present invention.

FIG. 1 illustrates an exemplary transceiver 10 in accordance with the present invention. Here, transceiver 10 comprises a direct-conversion (homodyne) receiver 12, a transmitter 14, control and processing circuits 16, and a directional coupler 18. Generally, the transceiver 10 operates in one of two modes. In a first mode, the receiver 12 is used to downconvert received signals obtained from an associated antenna (not shown) and, in a second mode where the transmitter 14 is active, the receiver 12 is used to downconvert antenna-reflected transmit signals. Thus, in the first mode of operation, the control and processing circuits 16 process the baseband signal output by receiver 12 to obtain received signal information transmitted from a remote station and, in the second mode of operation, processes the baseband signal output by receiver 12 to characterize a transmitter-to-antenna impedance mismatch.

More particularly, during the second mode of operation, the transmitter 14 generates a transmit signal which is coupled to the associated antenna through directional coupler 18, which provides reflected signal feedback to the receiver 12. Thus, during this second mode of operation the receiver 12 downconverts reflected transmit signals, thereby allowing processing circuit 16 to characterize the impedance mismatch. As will be shown later, the transmit signal may be coupled to the antenna through an adjustable matching circuit that is adjusted based on the characterized impedance mismatch such that, as antenna impedance changes, the processing circuit 16 updates its mismatch characterizations and makes the appropriate matching circuit adjustments.

Figure 2:
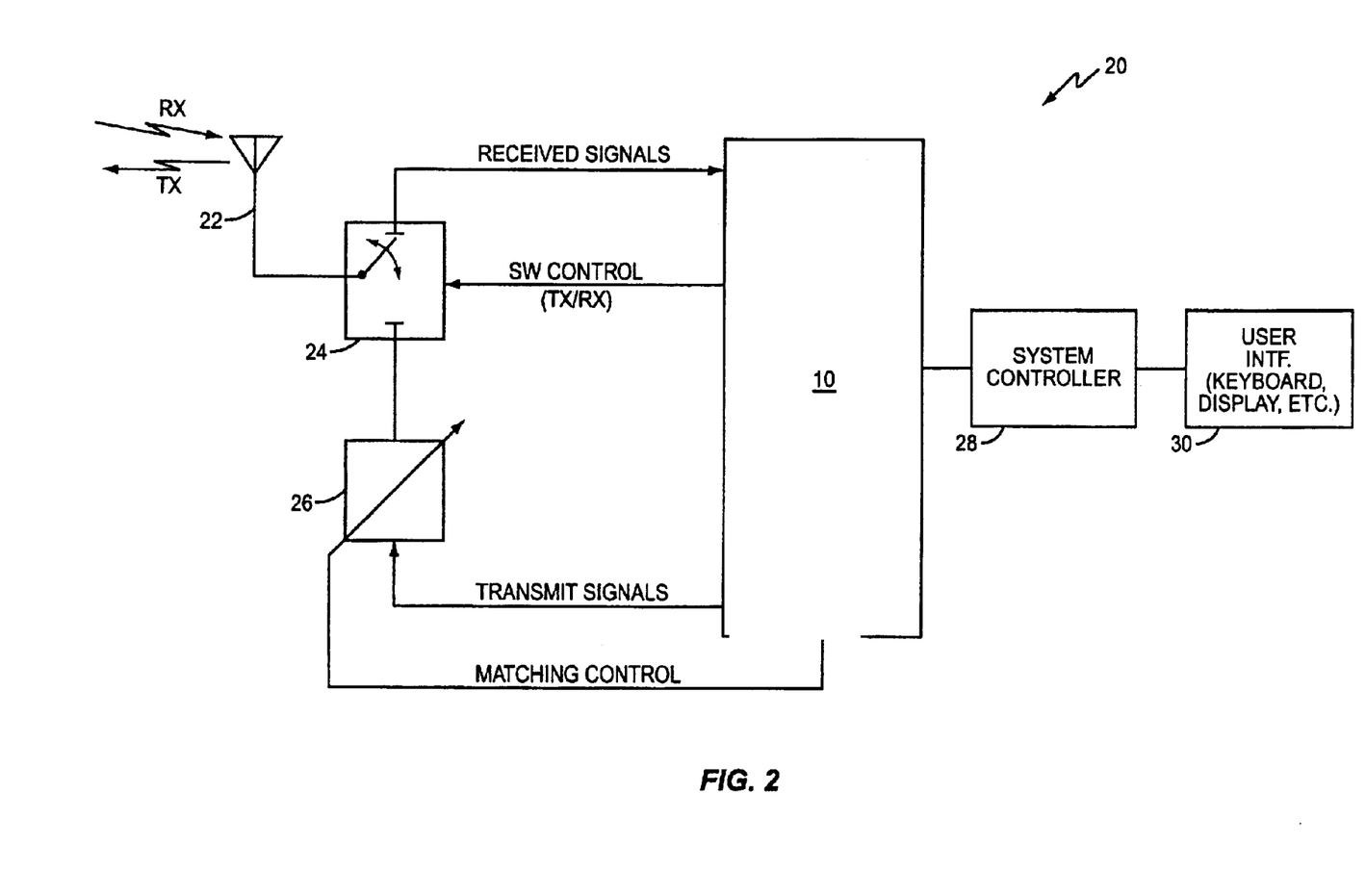
FIG. 2 is a diagram of an exemplary mobile station incorporating the transceiver of FIG. 1.

FIG. 2 illustrates a wireless communication device 20, such as a mobile station for use in a cellular radio communications system configured according to, for example, the GSM wireless communication standards. Communication device 20 includes transceiver 10, an antenna 22, a transmit/receive switch 24, an adjustable matching circuit 26, a system controller 28, and a user interface 30, which may include, for example, a keyboard, display, microphone, loudspeaker, etc. When transceiver 10 operates in a receive mode, it actuates switch 24 such that the receive signal path of transceiver 10 is coupled to antenna 22, and when transceiver 10 operates in the transmit mode, it actuates switch 24 such that the output of the impedance matching circuit 26, which is driven by the transceiver's output transmit signal, is coupled to antenna 22 through switch 24. Thus, when transceiver 10 operates in a receive mode, its homodyne receiver downconverts antenna-received signals to baseband data signals, and when transceiver 10 operates in the transmit mode, its homodyne receiver 12 downconverts antenna-reflected signals to baseband signals for impedance mismatch characterization operations.

Figure 3:
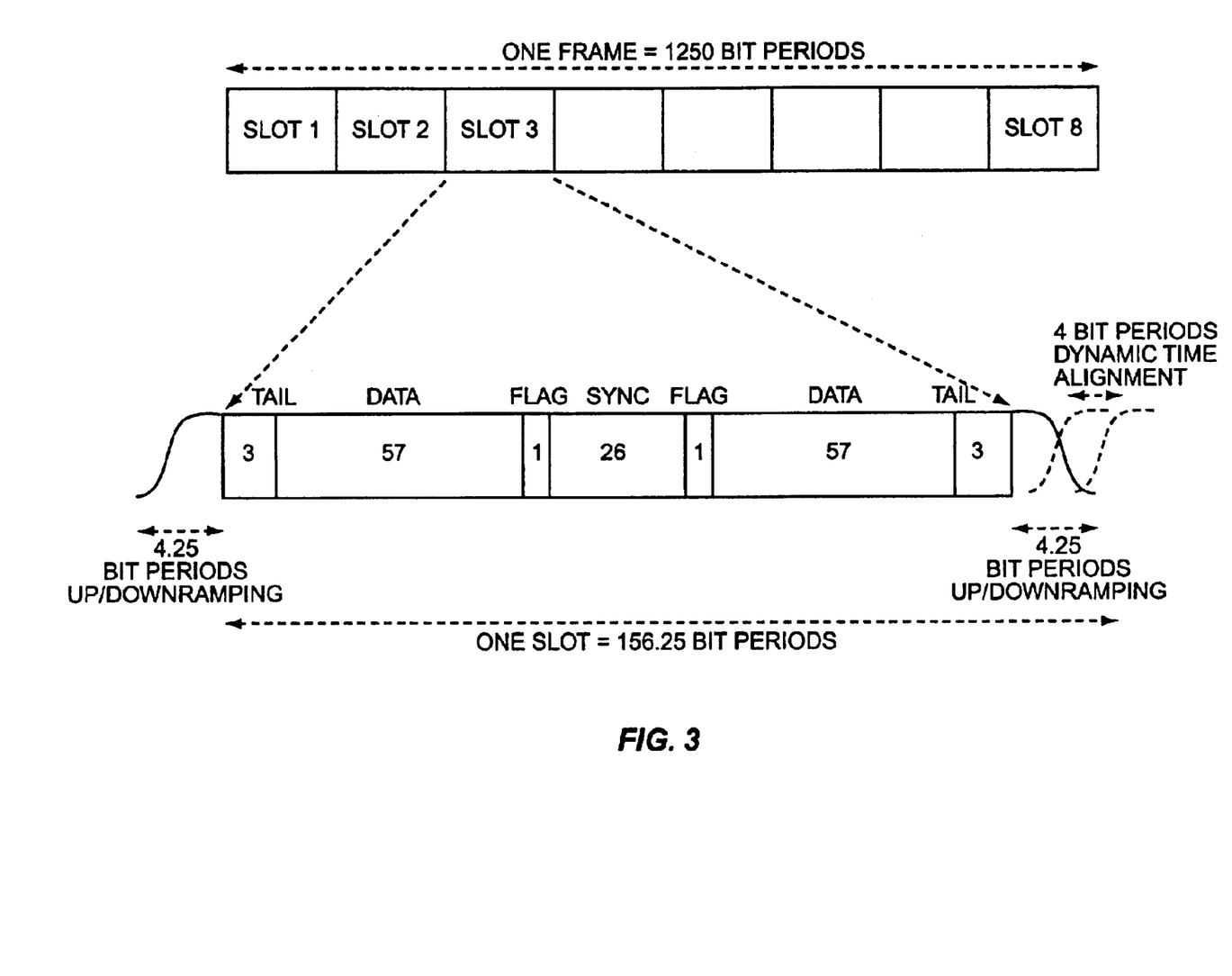
FIG. 3 is a diagram of exemplary TDMA signal frame and slot details.

Those skilled in the art will appreciate these alternating receive and transmit mode operations complement use of communications device 20 in, for example, a GSM-based cellular network, when mobile stations alternately transmit and receive according to assigned time slots. FIG. 3 illustrates such an arrangement.

A typical Time Division Multiple Access (TDMA) signal waveform frame and slot format is shown in FIG. 3. A full-rate frame comprises 1250 symbol or bit periods, divided into 8 timeslots of 156.25 symbol periods. The transmit and receive frame periods are staggered in time relative to each other by about 2.5 timeslots, so that if a mobile station is allocated transmit slot 3 for transmission, its correspondingly allocated receive slot number 3 would overlap transmit slot 1 of a different mobile station, and there would be about 1.5 slots of idle time between its receive slot and its transmit slot during which actions like changing the channel frequency synthesizer from receive to transmit, or changing its transmit/receive antenna switch from receive to transmit can take place.

When only one transmit and receive slot is allocated, for example for a relatively low data rate service such as voice, a somewhat longer gap of 4.5 slots exists between the end of the transmit slot and the next receive slot. This gap often is used to tune the receiver momentarily to a neighboring base station to perform a signal strength assessment which is used for determining when a handoff would be appropriate. The use of timeslotting allows ingenious use of idle time to simplify the mobile phone or improve the system performance as in the above-described examples, making TDMA the world's most popular digital cellular standard.

FIG. 3 further illustrates bit placement within a slot. An exemplary TDMA slot format provides 114 symbols of traffic data, two flag symbols of control data, 3+3 tail symbols to allow receive filters to ring down and channel echoes to die, 26 symbols of known synchronization data, and 4.25 symbol periods of inter-slot guard time where transmitter up/downramping can take place. With the present invention, antenna impedance matching adjustments may be made after the 4.25 bits of transmit downramping and before the next transmit upramping period, while avoiding making the adjustment during periods of reception.

One aim of the present invention is to obtain an accurate transmitter-to-antenna impedance match for signal transmissions to thereby improve transmitter linearity without resorting to the use of "isolators." Linearity is particularly important when high order symbol constellations such as linear 8-PSK are used. It is further contemplated that the characterization and adjustment operations of the present invention may be applied to receiver impedance matching.

However, providing independent antenna tuning for reception in a receive frequency band different than the transmit frequency band would require determination of the receive tuning codes based on the adaptively determined transmit frequency codes, or else predetermination of a set of fixed receive frequency codes, as it is more difficult to measure a mismatch in the receive state. Moreover, adjusting an impedance matching circuit for both receive and transmit operations in the TDMA environment would increase the number of switching cycles of tuning components within the adjustment circuit, which can result in switch longevity concerns. Present day Micro Electronic Machines (MEMS), which may be used to switch tuning components within the impedance matching circuit 26 demonstrate impressive longevity compatible with such frequency switching operations, and may thus be a preferred choice.

Figure 4:
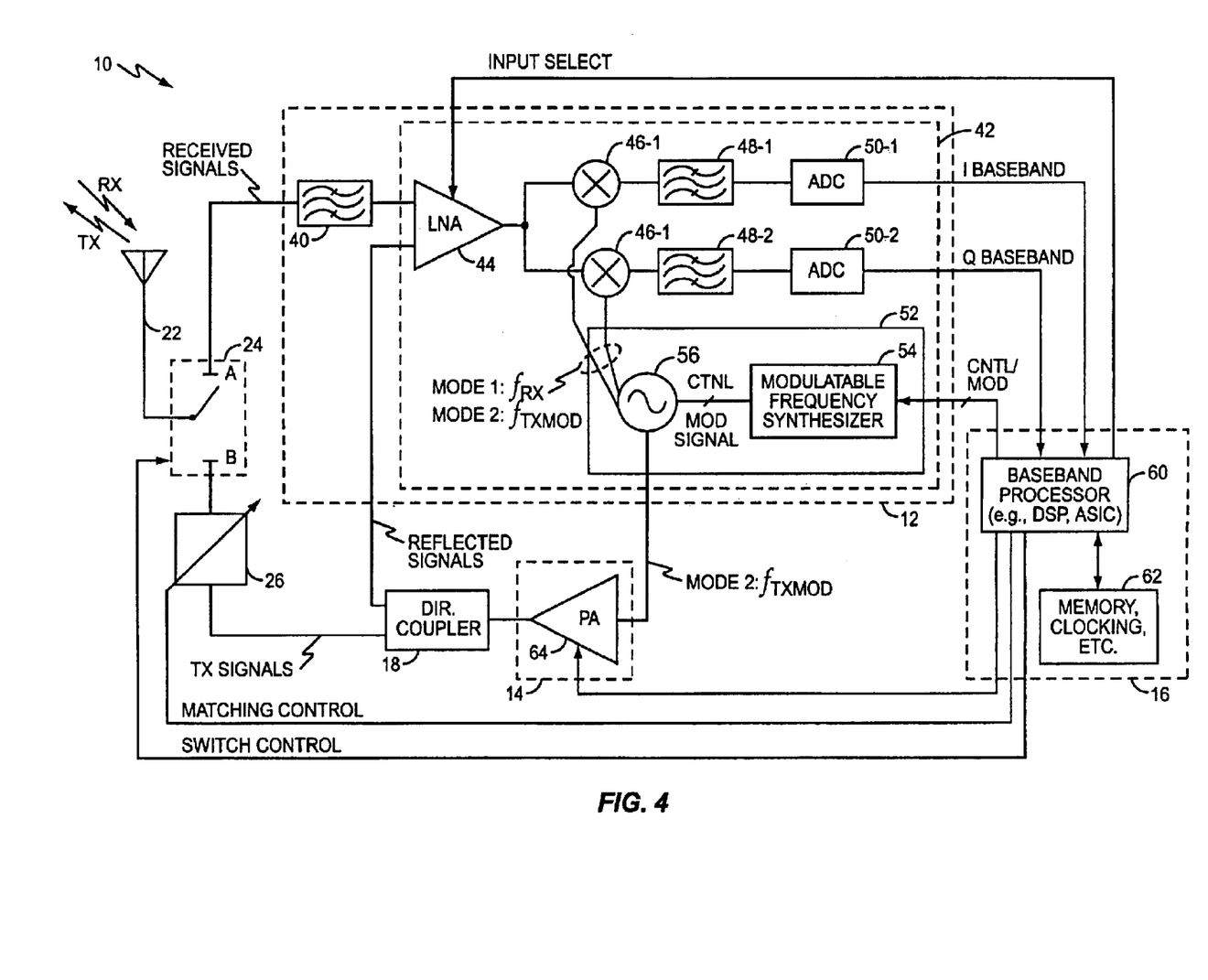
FIG. 4 is a diagram of exemplary details for the transceiver of FIG. 1.

Turning back to exemplary apparatus details, FIG. 4 illustrates an exemplary embodiment of transceiver 10, such as might be implemented in mobile station 20. Receiver 12 includes a receive filter 40 and a homodyne downconverter circuit 42, which includes in-phase (I) and quadrature (Q) downconversion signal paths comprising frequency mixers 46-1 and 46-2, baseband filters 48-1 and 48-2, and analog-to-digital-converters (ADCs) 50-1 and 50-2. Converter circuit 42 further includes a local oscillator circuit 52, which comprises a "modulatable" frequency synthesizer 54 and a voltage-controlled-oscillator (VCD) 56.

U.S. Pat. No. 5,834,987 to Applicant Dent of the instant application, and which is entitled "Frequency synthesizer systems and methods for three-point modulation with a DC response," discloses an exemplary modulatable frequency synthesizer, and is incorporated herein by reference. Additionally, exemplary but non-limiting homodyne receiver details may be found in the following U.S. patents to Applicant Dent et al., which are incorporated by reference herein:

U.S. Pat. No. 5,241,702, "D.C. offset compensation in a radio receiver";

U.S. Pat. No. 5,614,904, "Balance companded delta conversion for homodyne receiver";

U.S. Pat. No. 5,568,520, "Slope drift and offset compensation in zero-IF receivers"; and U.S. Pat. No. 5,749,051, "Compensation for second order intermodulation in a homodyne receiver".

Continuing with FIG. 4, processing circuit 16 includes baseband processor 60, which may comprise one or more microprocessors, ASICs, FPGAs, or other digital logic devices, and which cooperates with supporting circuits 62, such as clocking/timing control circuits, I/O interface circuits, and one or more memory devices, such as EEPROM or FLASH memory, to store instructions and calibration data, etc., as needed or desired. Finally, transmitter 14 is illustrated as comprising a power amplifier (PA) circuit 64, which is used to amplify a transmit signal to a level appropriate for transmission from antenna 22.

As was explained earlier, receiver 12 is used to downconvert received signals, i.e., remotely transmitted signals, to baseband during receive operations, and is used to downconvert reflected transmit signals to baseband during transmit operations. Here, downconverter circuit 42 includes an input amplifier 44 that has selectable inputs, one input being coupled to receive filter 40 to receive the antenna-received signals for downconversion, and one input being coupled to directional coupler 18 to receive the antenna-reflected signals for downconversion. Processor 60 generates or otherwise controls an input select signal that determines which input of amplifier 44 is selected.

The amplified signal output by amplifier 44 splits into I and Q downconversion signal paths. Thus, mixers 46-1 and 46-2 mix the amplified signal from amplifier 44 down to baseband using a mixing frequency signal supplied to them by local oscillator circuit 52. In support of this, baseband processor 60 commands local oscillator circuit 52 to generate a receive-frequency signal at the assigned receive channel frequency for output to mixers 46 such that the antenna-received signals are downconverted to baseband I and Q signals. The output signals from mixers 46 pass through baseband filters 48-1 and 48-2 and are then digitized into a stream of I/Q baseband signal samples by ADCs 50-1 and 50-2. Processor 60 thus receives the digitized I/Q sample streams as its baseband receive signal.

Thus, in the first mode of operation, homodyne receiver 12 converts an antenna-received signal on a selected receive channel frequency to a suitable form for processing, such as (I,Q) complex baseband samples in Cartesian format. This conversion enables processor 60 to recover transmitted data and control information conveyed by the received signal. In the second mode of operation, which may be a "transmit" mode for transceiver 10, baseband processor 60 controls switch 24 such that the transmitter 14 is coupled to antenna 22 through directional coupler 18 and impedance matching circuit 26, and controls amplifier 44 such that it amplifies the antenna-reflected signals provided to receiver 12 via coupler 18. Use of the dual-input amplifier 44 allows feedback of the antenna-reflected signals to bypass the receive band pass filter 40, which generally passes the receive frequency band while rejecting signals at the transmit frequency band.

Where transmitter 14 is required to transmit only constant envelope signals modulated purely in phase or frequency, such as GMSK signals according to the GSM standard, the modulated transmit signal may be produced by retuning local oscillator circuit 52 to the desired transmit channel frequency and providing a transmit modulation signal to frequency synthesizer 54. Thus, in an exemplary embodiment, processor 60 generates a modulation control signal based on desired transmit signal information and provides that signal to local oscillator circuit 52.

With such an arrangement, local oscillator circuit 52 outputs a pre-amplified version of the modulated transmit signal to mixers 46-1 and 46-2 of downconverter circuit 42 for use in downconverting the antenna-reflected transmit signals, and also outputs the pre-amplified modulated transmit signal to transmitter 14, which uses power amplifier circuit 64 to amplify the modulated transmit signal to a level suitable for transmission from antenna 22. With mixers 46 being driven by the pre-amplified version of the modulated transmit signal, their downconversion operations are coherent with the antenna-reflected transmit signal, meaning that downconversion substantially removes or otherwise "cancels" transmit signal modulation components from the downconverted baseband signals output by receiver 12 during the second mode of operation. Removal of the transmit signal modulation simplifies processing of the baseband signals to obtain a characterization of impedance mismatch.

Baseband processor 60 of processing circuit 16 thus provides impedance matching control signals to matching network 26 based on its processing of the baseband signals obtained from the receiver's downconversion of the antenna-reflected transmit signals. As noted, processor circuit 60 comprises, or otherwise includes, digital signal processing resources used to characterize the impedance mismatch between transmitter 14 and antenna 22 based on processing the baseband signals derived from the antenna-reflected signals.

In at least one embodiment, processor 60 characterizes the impedance mismatch during or just after transmission and then changes or adapts the matching circuit 26 sometime before the next transmission. Ideally, such matching changes are made when the transceiver is not actively transmitting or receiving. Periods when neither the transmitter 14 nor the receiver 12 are active exist, for example, in the guard times between TDMA bursts.

The quality of the impedance match achieved by controlling matching circuit 26 may be assessed by evaluating the signal reflected back to the power amplifier circuit 64. Directional coupler 18 separates forward and reflected signals and routes the reflected signal to an input of homodyne receiver 12, as detailed above. During transmit mode, processor 60 controls downconverter circuit 42 to select the antenna-reflected signal input for downconversion and further sets the local oscillator circuit 52 to the desired transmit frequency. Processor 60 then drives local oscillator circuit 52 with a modulation signal that represents desired transmit signal information, such as a phase-modulation information corresponding to desired control and data signaling.

Thus, as was noted above, the local oscillator signals presented to homodyne downconverters 46-1 and 46-2 used to downconvert the I and Q signal components is coherent with the transmit signal output from transmitter 14, such that reflected power is coherently detected by receiver 12 to provide real and imaginary components, i.e., complex baseband signals, to processor 60 after digitization in ADCs 50-1 and 50-2. The real (I) and imaginary (Q) values are then used by processor 60 to determine control signals for matching network 26 that will reduce the magnitude of the reflected signals and thereby improve load impedance matching between transmitter 14 and antenna 22.

As explained in the parent application, it is only necessary for processor 60 to quantize the reflected signal into the values "good enough impedance match" or "not good enough", and, in at least one embodiment, in the latter case to quantize the reflection coefficient value into one of a limited number of regions indicating where on the Smith chart the impedance lies. Thus, the Smith chart may be divided into five regions, for example, corresponding to "good enough" in the center region and four surrounding "not good enough" regions.

A small region defined around the chart center corresponds to a reflection coefficient of 0.1, or −20 dB, or a VSWR of 1.2, which is postulated to be good enough. The remainder of the Smith Chart outside the center region is classified into four "non good enough" quadrants, which correspond respectively to negative real parts of the reflection coefficient (regions 1 and 3); positive real parts of the reflection coefficient (regions 2 and 4); negative imaginary parts of the reflection coefficient (regions 1 and 2) and positive imaginary parts of the reflection coefficient (regions 3 and 4).

The "coarse" quantizing of good enough/not good enough laid out in the parent application was made to simplify the reflected signal evaluation circuits. However, the use of homodyne receiver 12 to provide reflected signal downconversion makes practical a fuller evaluation of impedance mismatch. That is, processor 60 may be used to make a more refined, or less coarse, characterization of the impedance mismatch than was suggested in the parent application. Thus, the present invention makes use of processor 60 to enable, if desired, more precise adjustment of impedance matching circuit 26 to maintain relatively tight control of impedance mismatch.

While the reflection coefficient for the antenna-reflected transmit signals actually is the complex ratio of the reflected transmit signal to the forward transmit signal, FIG. 4 does not explicitly illustrate measurement of the forward transmit signal. Rather, FIG. 4 illustrates measurement of the reflected signal based on feeding back the reflected signals from directional coupler 18 to receiver 12.

However the forward signal is known if the signal developed at the output of transmitter 14 is known, i.e., if its amplitude is known and the phase shift between local oscillator circuit 52 and the transmitter output is known. These factors can be calibrated, and calibration information stored in transceiver 10. For example, calibration characterizations over a range of power levels (and frequency, if necessary) may be stored in memory circuits within the processor support circuits 62.

Alternatively, instead of dumping the forward signal into a terminating load, receiver 12 may be configured with a third input on which it receives the forward signal. Processor 60 would then control receiver input selection to alternately downconvert the reflected signals and the forward signals, such that it has baseband samples of both and can thereby compute a true ratio of forward-to-reflected power. Such an approach would, in at least some cases, obviate the need for stored calibration tables. Thus, one might opt for a slightly more complex circuit implementation of transceiver 10, i.e., the use of forward and reflected signal feedback paths into receiver 12, or one might opt to calibrate transceiver 10 and store such calibration information in it.

In an exemplary embodiment, the frequency with which impedance matching adjustments are made is limited to once per TDMA frame, and the adjustments are based on classifying an average reflection coefficient over the transmit burst. Furthermore, as noted, adjustments are made when transceiver 10 is not transmitting, and generally are not made while it is receiving to avoid potentially interfering glitches. Such glitches are more likely where transceiver 10 couples its receiver 12 and transmitter 14 to antenna 22 through a duplexer circuit rather than through a transmit/receive switch.

Impedance matching adjustments can also be limited to being made less frequently than once per TDMA burst, for example to once per 100 ms, by using processor 60 to determine the average mismatch region over several bursts on the same channel frequency. In a more general sense, then, processor 60 may change the rate at which it adjusts matching circuit 26 based on observing how much the mismatch varies over time. For example, on a given call, a user may not reposition his or her mobile station for seconds or minutes during use and, consequently, the antenna impedance may change very little over a given observation window. Under such conditions, processor 60 would back off on the rate at which it made impedance matching adjustments and could, for example, continue with its mismatch characterization operations and make a matching adjustment only when the observed mismatch exceeded a defined threshold.

Additionally, previously converged matching circuit settings may be remembered in non-volatile memory such as in EEPROM or FLASH memory in support circuits 62 or within processor 60. Such remembered settings may be stored in, for example, a table structure that contains settings versus operating frequency. These values may be recalled as initial values whenever transmission on a previously used operating frequency occurs. These values may also be used whenever the power amplifier circuit 64 is operated at significantly less than its maximum operating power level, where track-and-adjust impedance matching operations may be suspended owing to the problematic nature of measuring reflection coefficients at very low transmit power levels.

Indeed, using a nominal, default, or remembered impedance match setting during low transmit power conditions may offer reasonably good performance because transmitter 14 is less affected by residual impedance mismatch at lower power levels. That is, good impedance matching, i.e., dynamic tracking-and-adjustment, is more important to preserve optimum transmission efficiency at the higher transmit power levels.

The transmit signal from transmitter 14 passes through directional coupler 18 with minimal loss and is thus applied to the input of the impedance matching circuit 26, which couples the transmit signal to terminal "B" of switch 24, thus connecting it to antenna 22. Mismatch between the output impedance of transmitter 14 and the antenna impedance of antenna 22 will cause a certain amount of the transmit signal to be reflected back and these antenna-reflected signals are provided by directional coupler 18 to a second input of the amplifier 44 in homodyne receiver 12. As part of its operations in the second mode, baseband processor 60 controls the input select signal amplifier 44 such that it amplifies these antenna-reflected signals applied to its second input. Thus, the homodyne downconversion circuit 42 downconverts the antenna-reflected signals using the actual modulated transmit signal for its downconversion operations. Thus, the I/Q baseband signal provided to baseband processor 60 during the second mode of operation may be characterized to determine the impedance mismatch between transmitter 14 and antenna 22. The use of the modulated transmit signal for downconversion operations effectively removes the transmit signal modulations from the baseband signal provided to baseband processor 60 during the second mode of operation such that the antenna mismatch may be more easily characterized without need for additional processing to remove the effects of transmit signal modulations.

Note that some relatively fixed phase difference may exist between the transmit signal loop out of transmitter 14 and the antenna-reflected signal loop back through downconverter circuit 42, and that such phase differences will appear in the downconverter baseband signals provided to baseband processor 60. However, because such phase shifts are substantially fixed and are determined by the particular design implementation, such fixed shifts may be characterized or otherwise calibrated, such as part of the manufacturing process of transceiver 10, and such phase shift characterizations may be stored in a memory device included in supporting circuit 62. Thus, during operation, baseband processor 60 would simply retrieve stored phase shift characterization information and use this to "null" any observed fixed phase shift in the baseband signal used to characterize impedance mismatch.

Referring back to FIG. 3, one observes that transceiver 10 may operate such that at repeated designated times (slots) it operates in receive mode, while it operates in transmit mode at other designated times. As such, transceiver 10 may operate in its first mode during receive operations, and operate in its second mode during transmit operations. Ideally, transceiver 10 would characterize a current antenna impedance mismatch condition during a first transmit slot, and then make adjustments to the impedance matching circuit 26 in advance of the next succeeding transmit slot. While substantial flexibility exists with regard to the specific timing of these characterization and adjustment steps, one caveat is that there may be advantages in prohibiting adjustment of the impedance matching circuit any time that transmit or receive operations are active. Of course, the prohibitions against adjusting matching circuit 26 during active receive operations is more significant when the impedance matching circuit is coupled to or part of the antenna-received signal path. Such configurations are shown later herein.

Figure 5:
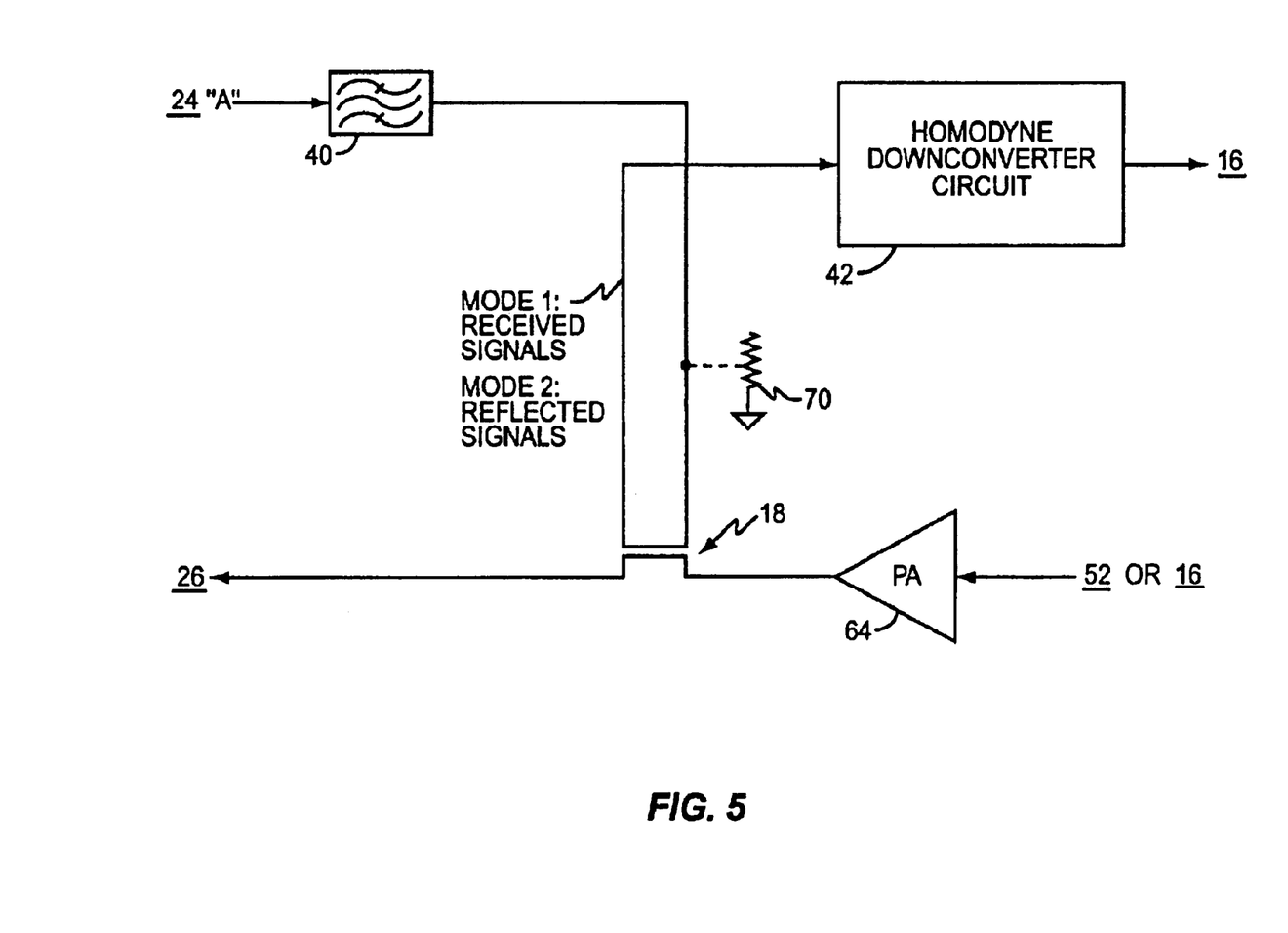
FIG. 5 is a diagram of an exemplary coupling arrangement for antenna-received and antenna-reflected signals.

FIG. 5 shows an alternative coupling arrangement that offers minimal parts count and reduced circuit space. Coupler 18 may be implemented, for example, as a pair of appropriately spaced parallel "traces" on a printed circuit board (PCB). Further, the depicted coupling arrangement obviates the need for dual, selectable inputs into amplifier 44. That is, homodyne downconverter circuit 42 may be implemented with a single input amplifier 44 that is coupled to filter 40 through directional coupler 18, as shown.

More particularly, the output from the receive filter 40 is coupled to homodyne converter circuit 42 through the "through" path of directional coupler 18, which is a low-loss path. When T/R switch 24, which may be integrated into matching network 26, is operated to connect transmitter 14 to antenna 22, there is no signal from the antenna to filter 40, but PA circuit 64 is now transmitting and transmit signals reflected from the antenna matching network 26 are coupled by directional coupler 18 to the homodyne downconverter.

Forward-traveling transmit signals are also coupled by directional coupler 18 toward receive filter 40. Therefore, if the receive filter 40 is not absorptive (i.e., is not a good 50 Ohm termination) at the transmit frequencies of interest, these forward signals would be reflected from filter 40 into homodyne converter circuit 42, thereby confusing them with the antenna-reflected signals. If filter 40 is completely reflective at the transmit frequency, a 50 ohm load 70 should be switched across the signal lines, e.g., PCB traces or wires, between filter 40 and directional coupler 18 at a point, as indicated by dashed lines, where the phase of the reflection coefficient represents a high impedance.

Another notable aspect regarding the arrangement depicted in FIG. 5 is that directional coupler 18 may be configured to impart a desired attenuation to the antenna-reflected signals input to homodyne downconverter circuit 42. That is, the amplitude of the antenna-reflected signals may be expected to be higher than that of the typical antenna-received signal. Thus, attenuation of the antenna-reflected signals may be desirable to bring them within the signal range appropriate for the receiver's sensitivity.

Figure 6:
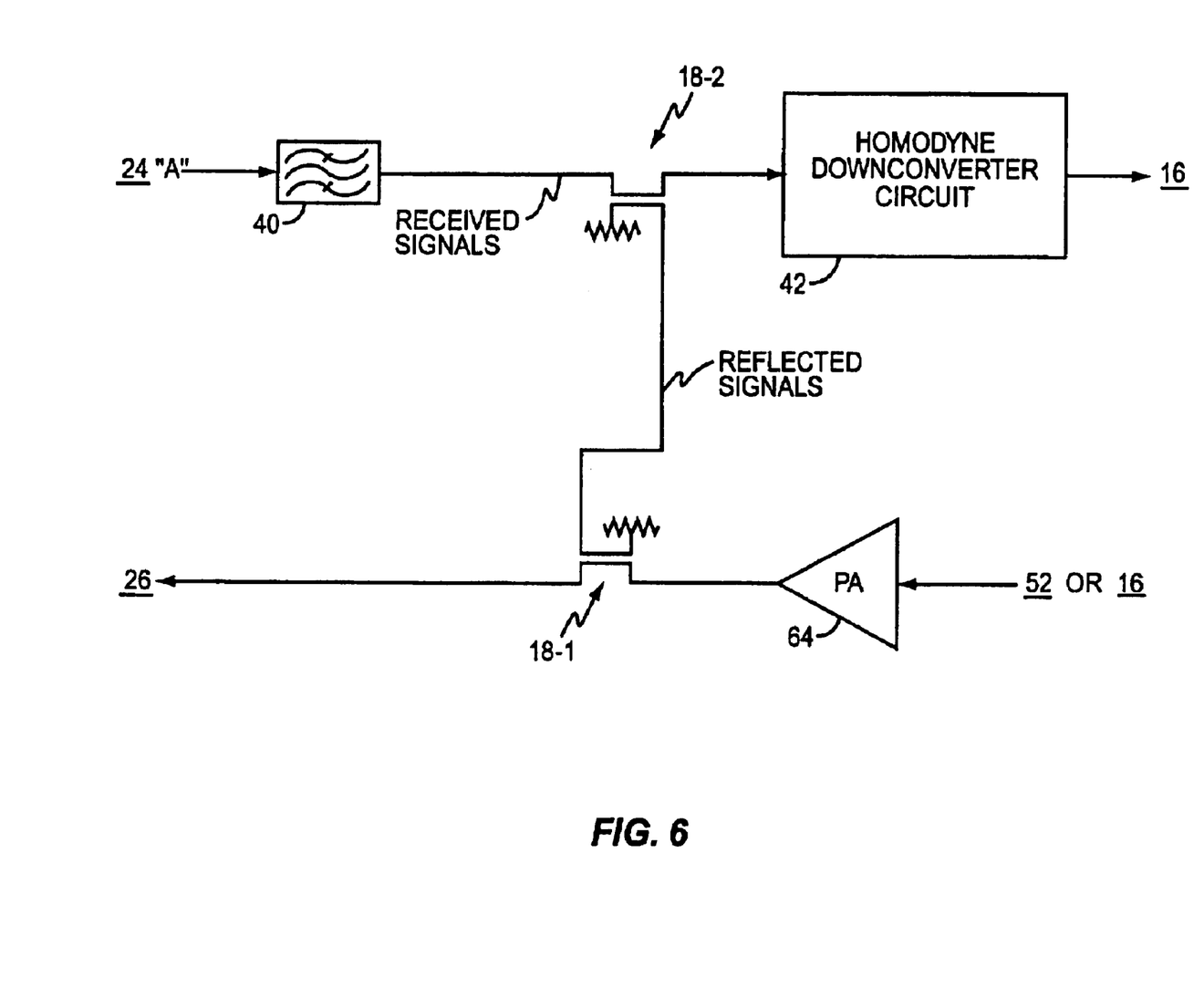
FIG. 6 is a diagram of another exemplary coupling arrangement for antenna-received and antenna-reflected signals.

FIG. 6 illustrates another exemplary embodiment for coupling the reflected signals into the homodyne receiver 12. Here, the reflected signals are coupled out of the transmit signal path using coupler 18-1 and then coupled into the homodyne receiver path using coupler 18-2. With this arrangement, the reflection coefficient of receive bandpass filter 40 at the transmit frequency is unimportant. If a coupling attenuation of 30 dB in total is required, both coupler 18-1 and 18-2 may be −15 dB couplers. Typical output power from transmitter 14 is 1 watt (+30 dBm) so −30 dB of coupling would inject 0 dB into the homodyne downconverter circuit 42 if the antenna was completely reflective, i.e., all power reflected back, or would inject −20 dBm if the antenna VSWR was 1.2.

Since an exemplary homodyne receiver 12 has a receive sensitivity in the order of −100 dBm, there is ample sensitivity to sense antenna-reflected signals even when the transmitter 14 operates at less than its full power output. However, the homodyne downconverter circuit 42 may exhibit dc offsets on its I and Q outputs that are significant compared to the baseband signal level, particularly when the antenna reflection coefficient is low, or when transmitter 14 is operating at low transmit powers. These dc offsets may be learned by recording the I,Q values with the PA switched off. The learned offsets may then be subtracted from the I,Q values when the PA is switched on. Thus, processor 60 may be programmed to detect and store the receiver's I/Q dc offsets, and then "null" the effects of any such offsets using the stored values. To this end, processor 60 may be programmed to refresh its stored offset values over time, such as by measuring and storing offsets at spaced apart time intervals to account for varying temperature, etc.

Figure 7:
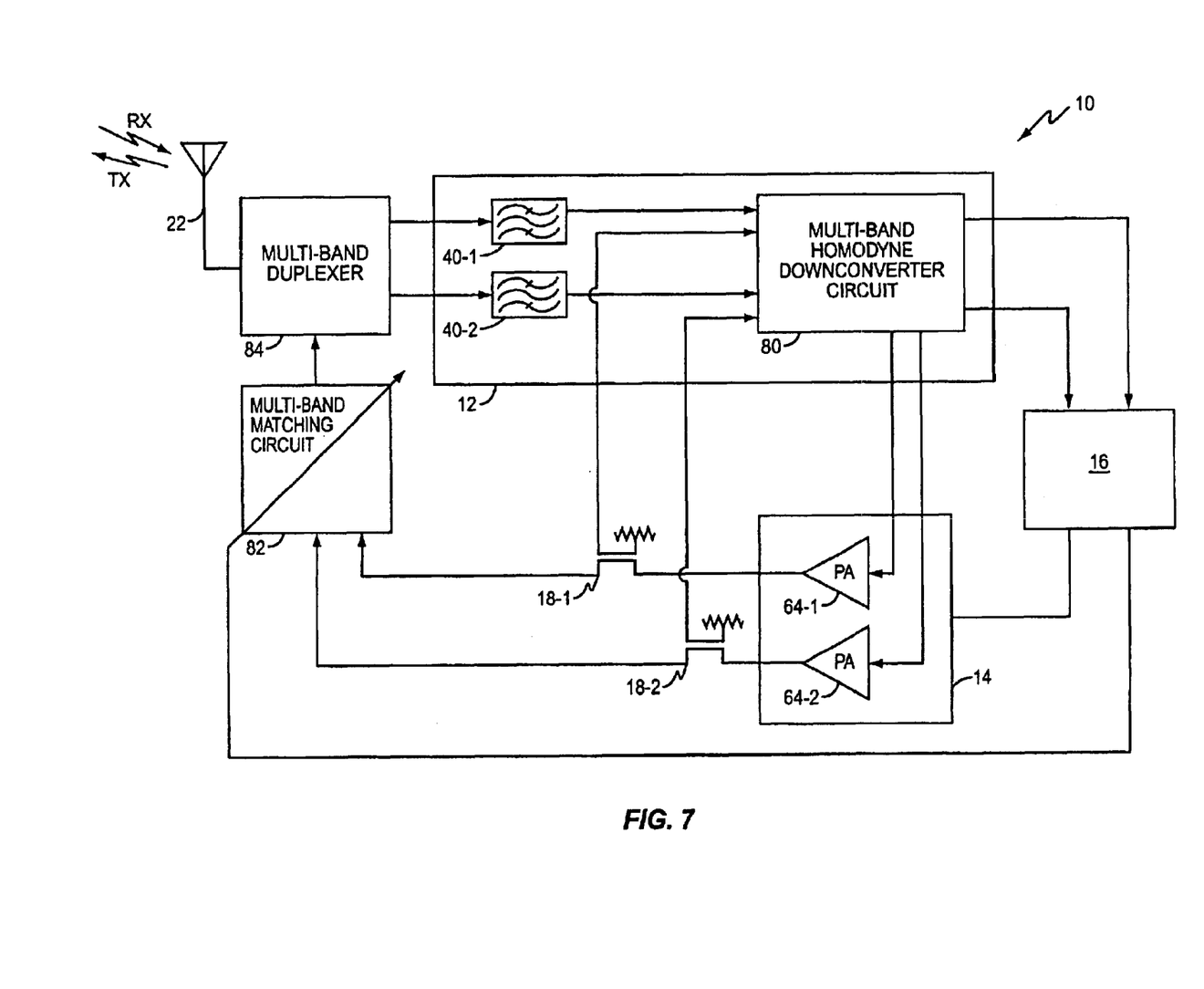
FIG. 7 is a diagram of an exemplary multi-band transceiver according to the present invention.

FIG. 7 is another exemplary embodiment of the present invention. Here, transceiver 10 is implemented as a "multi-band" transceiver, and thus includes selective bandpass receive filters 40-1 and 40-2, each passing a different frequency band, and both feeding into a multi-band homodyne downconverter circuit 80, which may be patterned on the earlier-illustrated downconverter circuit 42 but with multi-band filters. The multi-band transceiver 10 further includes two or more PA circuits 64-1 and 64-2, a multi-band matching circuit 82, and a multi-band duplexer 84. As in the single band embodiments described earlier herein, matching circuit 82 may be integrated with duplexer 84.

PA circuits 64-1 and 64-2 are coupled to matching circuit 82 through directional couplers 18-1 and 18-2, respectively. Thus, coupler 18-1 feeds back antenna-reflected signals for the transmit frequency band associated with PA circuit 64-1, while coupler 18-2 performs the same function but does so for antenna-reflected signals associated with a second transmit frequency band. Of course, if transceiver 10 is intended to operate at more than two transmit frequency bands, additional PA circuits 64 and couplers 18 could be used. (The same comment applies to adding bandpass filters 40 as needed to accommodate additional receive frequency bands.)

In any case, as before, the directional couplers 18 separate the antenna-reflected signals and route them to the appropriate input of the multi-band homodyne downconverter circuit 80 for coherent detection and resolution into complex baseband samples. As such, any of the variations mentioned above for single-band embodiments of transceiver 10, such as shown in FIGS. 1 and 4, may also be applied to multi-band embodiments of transceiver 10.

Figure 8:
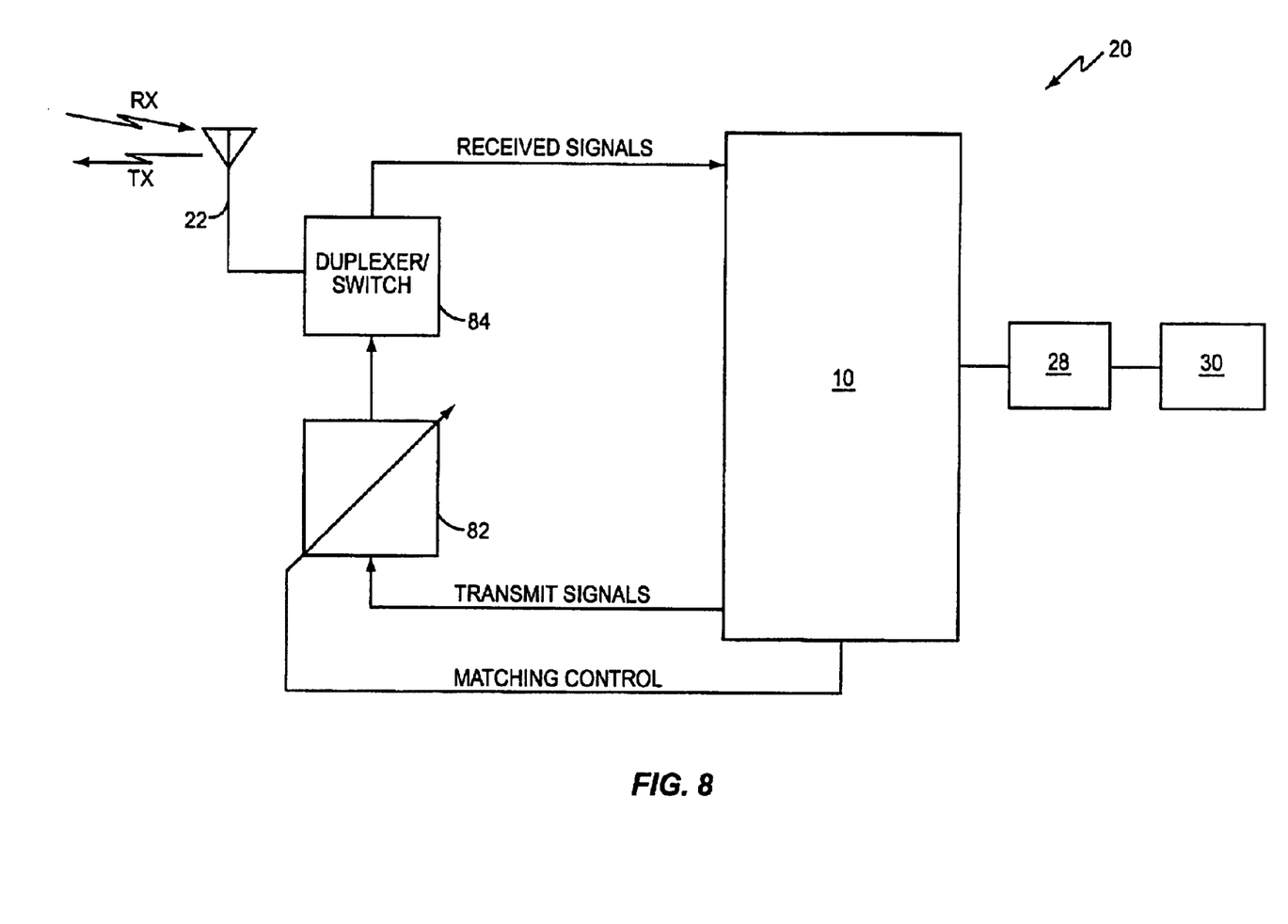
FIG. 8 is a diagram of an exemplary multi-band mobile station incorporating the transceiver of FIG. 7.

FIG. 7 illustrates a version of the invention that may be used for non-constant-envelope modulation, while FIG. 8 illustrates an exemplary embodiment of mobile station 20 configured with multi-band embodiment of transceiver 10. In FIG. 7, the unmodulated transmit signal from the homodyne local oscillator is applied to a modulator (400a . . . 400b) for the selected band. Signal processor 60 generates modulation signals, such as I,Q modulation signals. The modulation may modulate the phase of the transmit signal and thereby the phase of the reflection signal relative to the unmodulated local oscillator. Thus the I,Q signals from the homodyne downconverter comprise the reflected signal rotated in phase by the modulation. Since the modulation was however produced by, and therefore known to the signal processor (204), the phase rotation may be removed by dividing the resolved reflected signal, I,Q components by the I,Q modulation components. The resulting demodulated reflected signal components may then be averaged over several modulation symbols. DC offsets present on the homodyne downconverter I,Q outputs are rotated by the process of removing the modulation, and therefore average to zero over a number of modulation symbols, thereby increasing the dynamic range of reflected signals that can be accurately evaluated.

Figure 9:
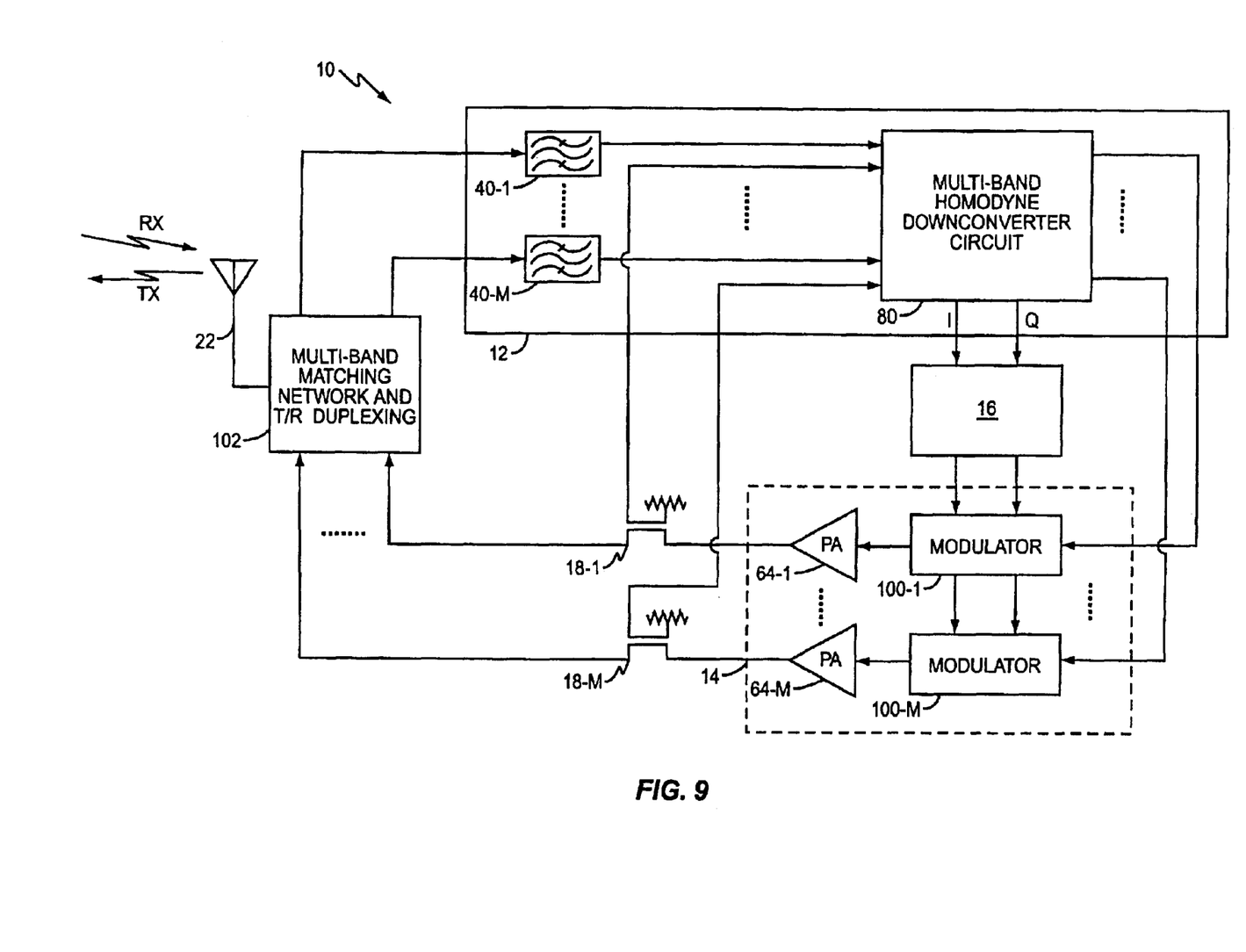
FIG. 9 is a diagram of another exemplary multi-band transceiver embodiment.

FIG. 9 illustrates an exemplary embodiment of transceiver 10 that has particular applicability in systems that use non-constant-envelope modulation. With this arrangement, the local oscillator circuit(s) 52 of homodyne downconverter circuit 42 (or circuit 80 in the multi-band implementations) is not used to provide a modulated transmit signal, although it may still be retuned during transmit mode to provide an unmodulated carrier signal at the desired transmit frequency. Thus, the unmodulated transmit signal from local oscillator circuit 52 is output to each of transmit modulators 100-1 through 100-M, where there are "M" transmit frequency bands, and M essentially is any practical number, e.g., 2, 3, and so on. (Note that this arrangement is completely applicable to the single-band embodiment of FIG. 4 as well.)

In an exemplary multi-band embodiment, transmit modulators 100-x and PA circuits 64-x that currently are not in use may be unpowered or otherwise de-selected and, regardless, the unmodulated transmit signal may be selectively applied to the "active" transmit modulator. Regardless, processor generates modulation signals, such as I,Q modulation signals. The modulation may modulate the phase of the transmit signal and thereby the phase of the reflection signal relative to the unmodulated local oscillator. Thus the I,Q signals from the homodyne downconverter 80 (or 42) comprise the reflected signal rotated in phase by the modulation. That is, if transmit signal modulation is applied to the transmit signal and that same modulation is not applied to the mixers 46 in homodyne downconverter circuit 80 (or 42), then downconversion of the antenna-reflected signals will not be coherent with respect to transmit signal modulations.

However, since the modulation was produced by processor 60, and therefore known to it, the phase rotations appearing in the baseband samples may be removed by dividing the resolved reflected signal, I,Q components by the I,Q modulation components. That is, the processor 60 may store, at least temporarily, the modulation components used to generate the transmit signal, and then use those stored components (plus any stored phase transmitter-to-receiver phase shifts) to remove the effects of transmit signal modulation from the baseband samples of the antenna-reflected signals.

The resulting demodulated reflected signal components may then be averaged over several modulation symbols. DC offsets present on the homodyne downconverter I,Q outputs are rotated by the process of removing the modulation, and therefore average to zero over a number of modulation symbols, thereby increasing the dynamic range of reflected signals that can be accurately evaluated.

Figure 10:
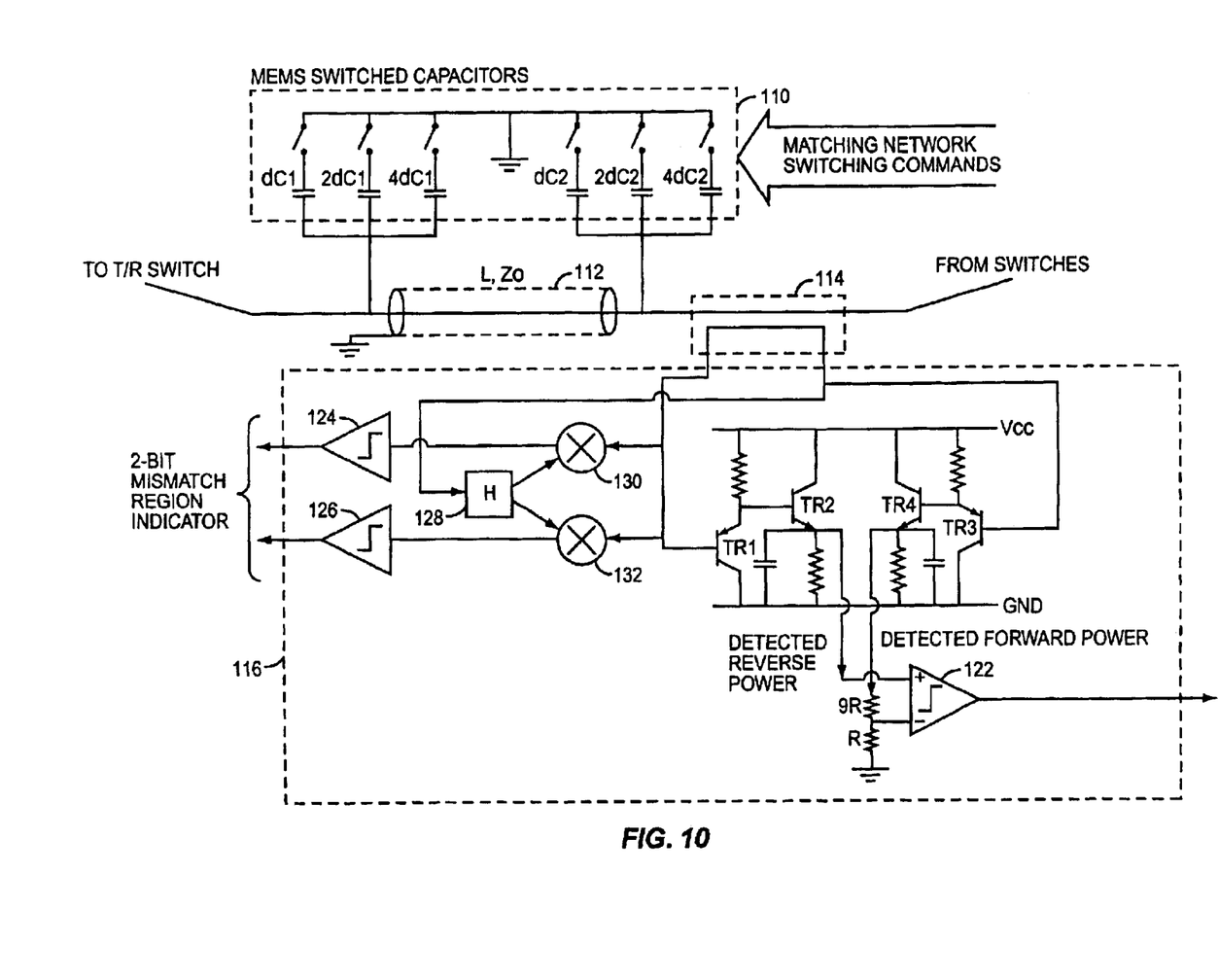
FIG. 10 is a diagram of an exemplary adjustable impedance matching circuit and an exemplary impedance mismatch characterization circuit.

FIG. 10 illustrates exemplary details for one embodiment of matching network 26, and these same details may be incorporated into any of the other embodiments, e.g., the multi-band matching network 82, irrespective of whether or not the matching network and duplexer/switch comprise an integrated assembly.

As shown, an exemplary impedance matching network comprises a length L of transmission line 112 having a characteristic impedance Zo, and having capacitor C1 at one end and capacitor C2 at the other end. C1 and C2 are "adjustable" and processor 60 can thus tune transmission line 112 for better impedance matching of transmitter 14 to antenna 22 by controlling the capacitance presented by C1 and C2.

In an exemplary embodiment, capacitors C1 and C2 each are formed as sets of switched capacitors 110. More particularly, as a set of three capacitors (C1=some combination of dC1, 2dC1 and 4dC1, and C2=some combination of dC2, 2dC2 and 4dC2).

When Zo of line 112 is greater than the target matched impedance (e.g. 50 ohms) and when its length is less than one-quarter wavelength, its influence is similar to that of a series inductance; hence the network formed by C1, line 112, and C2, can be likened to a "Pi-network." The switched capacitors C1 and C2 at each end of transmission line 112 are in a binary ratio, i.e., dC1:2dC1:4dC1 at one end and dC2:2dC2:4dC2 at the other end, where dC1 and dC2 are the minimum step changes. The capacitance is thus variable from 0 to 7dC1 or 0 to 7dC2 respectively upon operating the illustrated selection switches with, for example, two, 3-bit binary control signals from processor 60. The switches may be PIN diodes, FETs such as Gallium Arsenide FETs, or, as stated MEMS devices.

In one or more embodiments, processor 60 processes the baseband outputs from receiver 12 obtained from the antenna-reflected signals to obtain impedance mismatch characterization at essentially any desired level of precision. Thus, during its characterization operations, processor 60 could determine the impedance mismatch between transmitter 14 and antenna 22, and then output control signals to set the switched capacitors 110 to a configuration that provides the closest possible impedance match. As noted, then, processor 60 would subsequently update that configuration as needed to maintain dynamic tracking and compensation of impedance mismatch over time.

As an alternative, the "coarse" quantization approach outlined in the parent application may be used. With that approach, coarsely quantized reflection coefficient values are sufficient for processor 60 to determine, based on pre-programmed rules, whether to increase or decrease capacitance C1 or C2 or both by a minimum step dC1 or dC2 respectively. The preprogrammed rules ensure that the decided action always results in a movement of the impedance towards and ultimately into the central "good enough" area of the Smith chart described earlier herein and fully illustrated in the parent application. The preprogrammed set of rules is one of a finite number of all possible sets of rules. The number of possible sets of rules is determined by selecting one of the possible actions (–dC1, 0, dC1) combined with (–dC2, 0, dC2) a total of nine possible actions, for each of the four regions and for each of the 64 possible pre-existing switched capacitor states, a total of $64 \times 9^4$.

The selection of one of these sets of rules is independent on the choice of antenna 22 or mobile station 20 and can be determined by simulation. Then the 64×4 values of the decided capacitance changes can be combined with the pre-existing (one of 64) capacitor switch states to determine the new capacitor switch state after the change, and the 6 switch control bits required to program the switch states of C1 and C2 can be stored in a 256-byte look-up table.

One such table may be required per frequency band in which operation is required. Recalling that the quadrature mixers 46 of homodyne converter circuit 42, or of the multi-band converter circuit 80, are used in the present invention to detect the reflected power (or the forward power, if desired) using the local oscillator circuit 52 as the reference. If desired, another input may be provided into receiver 12 for routing the forward power signal into receiver 12. Internally, selection means can be provided to perform any or all of the following operations upon command:

(i) detect forward power signal against the local oscillator;

(ii) detect the reflected power signal against the local oscillator; and (iii) detect the reflected power signal against the forward power signal by replacing the local oscillator signal with the forward power signal.

Of course, whether any or all of these possible characterizations are performed may be left as a matter of design choice based on the requirements of a particular application. Similarly, the choice between single-band and multi-band implementations of transceiver 10 is also driven by the needs of a particular application.

Indeed, those skilled in the art will recognize the opportunity for substantially varying the implementation details of transceiver 10. As noted, receiver 12 may be used to generate a constant-envelope modulated transmit signal for amplification by transmitter 14, with the added benefit of providing coherent downconversion of the antenna-reflected signals, i.e., essentially automatic removal of the transmit modulations from the downconverted baseband signals input to processor 60 for impedance characterization. Alternatively, where the transmit signal modulation format is a non-constant envelope format, transmitter 14 generates the modulated transmit signal but may still receive an umodulated carrier signal at the desired transmit frequency from receiver 12. Either such variation may be used in single-band or multi-band implementations of transceiver 10.

Those skilled in the art will recognize other opportunities for variation, and recognize other features and advantages of the present invention. As such, the present invention is not limited by the foregoing description and accompanying drawings, but rather is limited only by the following claims and their reasonable equivalents.

What is claimed is:

1. In a transceiver comprising a transmitter and a homodyne receiver, a method of characterizing an impedance mismatch between the transmitter and an associated antenna, the method comprising:

configuring the homodyne receiver to receive and downconvert antenna-received signals to baseband signals during a first mode of transceiver operation and to receive and downconvert antenna-reflected signals to baseband signals during a second mode of transceiver operation; and processing the baseband signals generated by the homodyne receiver in the first mode to obtain received signal data and processing the baseband signals generated by the homodyne receiver in the second mode to characterize an impedance mismatch between the transmitter and the associated antenna.

2. The method of claim 1, further comprising defining the first mode of transceiver operation as a receive mode, and the second mode of transceiver operation as a transmit mode, such that the antenna-reflected signals downconverted by the homodyne receiver during the second mode of operation comprise transceiver transmit signals reflected by the associated antenna.

3. The method of claim 2, operating the transceiver in the first mode during a designated receive time slot and operating the transceiver in the second mode during a designated transmit time slot.

4. The method of claim 3, comprising alternating transceiver operation between the first and second modes over a succession of alternating receive and transmit time slots.

5. The method of claim 1, wherein configuring the homodyne receiver to receive and downconvert antenna-received signals to baseband signals during a first mode of transceiver operation comprises generating a mixing signal at a receive frequency to be used for downconverting the antenna-received signals to baseband.

6. The method of claim 5, wherein configuring the homodyne receiver to receive and downconvert antenna-reflected signals to baseband signals during a second mode of transceiver operation comprises generating the mixing signal at a transmit frequency to be used for downconverting the antenna-reflected signals to baseband, and to be used for generating a transmit signal at the transmit frequency.

7. The method of claim 6, further comprising modulating the mixing signal during the second mode of transceiver operation according to desired transmit signal information such that the antenna-reflected signals are downconverted to baseband signals coherently with transmit signal modulations.

8. The method of claim 7, further comprising generating a transmit signal for transmission from the associated antenna based on amplifying the modulated mixing signal.

9. The method of claim 1, further comprising downconverting the antenna-received signals using an unmodulated mixing signal at a receive frequency, and downconverting the antenna-reflected signals using a modulated mixing signal at a transmit frequency, the modulated mixing signal being modulated according to desired transmit signal information.

10. The method of claim 1, wherein the transceiver is included in a mobile station operating according to the Wideband CDMA (WCDMA) standards.

11. The method of claim 1, wherein the transceiver is included in a mobile station operating according to the Global Standard for Mobile communications (GSM) standards.

12. The method of claim 1, further comprising adjusting an impedance matching circuit in a transmit signal path based on the characterized impedance mismatch obtained by processing the baseband signals generated by the homodyne receiver in the second mode.

13. The method of claim 1, wherein processing the baseband signals generated by the homodyne receiver in the second mode to characterize an impedance mismatch between the transmitter and the associated antenna comprises computing an averaged impedance mismatch value over two or more transmit symbol times defined for the transmit signal.

14. The method of claim 1, wherein processing the baseband signals generated by the homodyne receiver in the second mode to characterize an impedance mismatch between the transmitter and the associated antenna comprises compensating the baseband signals using a stored phase shift value that characterizes a receiver-to-transmitter phase shift experience by the antenna-reflected signals relative to the transmit signal.

15. The method of claim 1, further comprising determining whether the baseband signal is affected by any dc errors, storing one or more values to characterize dc errors, if any, and compensating the baseband signals for dc errors using the stored values.

16. A transceiver to transmit and receive signals from an associated antenna, the transceiver including:
a homodyne receiver to generate a baseband signal by downconverting antenna-received signals in a first transceiver mode and by downconverting antenna-reflected signals in a second transceiver mode, said antenna-reflected signals being reflected transmit signals of the transceiver; and
a processing and control circuit to characterize an impedance mismatch between a transmitter portion of the transceiver and the associated antenna based on processing the baseband signal in the second transceiver mode.

17. The transceiver of claim 16, wherein the homodyne receiver includes a first receiver input coupled to the associated antenna and operative to receive the antenna-received signals and a second receiver input coupled to an output of the transmitter portion of the receiver and operative to receive the antenna-reflected signals.

18. The transceiver of claim 17, wherein a directional coupler provides the antenna-reflected signals to the second receiver input of the homodyne receiver.

19. The transceiver of claim 16, wherein the homodyne receiver includes a selectable input amplifier that amplifies the antenna-received signals in the first transceiver mode and amplifies the antenna-reflected signals in the second transceiver mode.

20. The transceiver of claim 19, wherein the control and processing circuit controls the selectable input amplifier.

21. The transceiver of claim 16, wherein the transmitter portion of the transceiver includes a directional coupler positioned in a transmitter output signal path to obtain the antenna-reflected signals as reflected transmit signals resulting from an impedance mismatch between the transmitter portion of the transceiver and the associated antenna.

22. The transceiver of claim 21, wherein the homodyne receiver includes a receiver input filter coupled to a homodyne receiver input to filter the antenna-received signals, and wherein the antenna-reflected signals bypass the receiver input filter.

23. The transceiver of claim 22, further comprising a second directional coupler to couple the antenna-reflected signals to the homodyne receiver input.

24. The transceiver of claim 16, further comprising a local oscillator circuit that generates a non-modulated mixing signal at a receive frequency for downconverting the antenna-received signals in the first transceiver mode, and generates a modulated mixing signal at a transmit frequency for downconverting the antenna-reflected signals in the second transceiver mode.

25. The transceiver of claim 24, wherein the control and processing circuit generates a modulation signal to control generation of the modulated mixing signal.

26. The transceiver of claim 25, wherein the transmitter portion of the transceiver generates the transmit signals by amplifying the modulated mixing signal, such that transmit signal modulations are substantially removed from the baseband signal generated by the homodyne receiver during operation in the second transceiver mode, thereby simplifying characterization of impedance mismatches.

27. The transceiver of claim 26, wherein the control circuit averages the baseband signal over a number of modulation symbol periods of the modulated mixing signal to reduce effects of any dc offsets in the homodyne receiver that affect generation of the baseband signal.

* * * * *